US011323111B1

(12) United States Patent
Lin

(10) Patent No.: US 11,323,111 B1
(45) Date of Patent: May 3, 2022

(54) HIGH-FREQUENCY SIGNAL DETECTOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/140,179

(22) Filed: Jan. 4, 2021

(51) Int. Cl.
*H03K 5/153* (2006.01)
*H03K 5/24* (2006.01)
*G05F 3/24* (2006.01)
*H02M 7/217* (2006.01)

(52) U.S. Cl.
CPC .............. *H03K 5/24* (2013.01); *G05F 3/24* (2013.01); *H02M 7/217* (2013.01)

(58) Field of Classification Search
CPC ........ H03K 5/2481; H03K 5/249; H03K 5/08; H03K 5/24; G01R 19/16519
USPC ......................................................... 327/77
See application file for complete search history.

(56) References Cited

U.S. PATENT DOCUMENTS

| 8,854,028 | B2 | 10/2014 | Lin | |
|---|---|---|---|---|
| 9,184,671 | B2* | 11/2015 | Yoshida | H02M 7/02 |
| 2004/0124906 | A1* | 7/2004 | Gist | H04L 25/062 |
| | | | | 327/530 |
| 2013/0335038 | A1* | 12/2013 | Lee | H02M 1/126 |
| | | | | 320/166 |
| 2015/0070949 | A1* | 3/2015 | Mukhopadhyay | H04Q 9/00 |
| | | | | 363/48 |
| 2018/0062416 | A1* | 3/2018 | Terry | H02M 7/32 |
| 2019/0165691 | A1* | 5/2019 | Telefus | H02M 7/162 |
| 2019/0257860 | A1* | 8/2019 | Bai | G01R 19/165 |
| 2021/0119834 | A1* | 4/2021 | Schubert | H04L 25/0272 |

\* cited by examiner

*Primary Examiner* — Quan Tra
(74) *Attorney, Agent, or Firm* — McClure, Qualey & Rodack, LLP

(57) ABSTRACT

A method of signal detection includes receiving an input voltage signal; using AC (alternate current) coupling to couple the input voltage signal into a coupled voltage signal; establishing a DC (direct current) value of the coupled voltage signal using a resistor; generating a self-mixed voltage signal by performing a self-mixing of the coupled voltage signal using a pair of cross-coupling MOS (metal oxide semiconductor) transistors; generating an output voltage by applying low-pass filtering on the self-mixed voltage signal; generating a reference voltage using a reference current terminated with a reference load; and determining a logical signal by comparing the output voltage with the reference voltage.

12 Claims, 4 Drawing Sheets

HIGH-FREQUENCY SIGNAL DETECTOR AND METHOD THEREOF

BACKGROUND OF THE DISCLOSURE

Field of the Disclosure

The present disclosure generally relates to circuits and methods for high-frequency signal detection.

Description of Related Art

In many applications, it is needed to detect whether an amplitude of a high-frequency signal is above or below a target value. In U.S. Pat. No. 8,854,028, Lin discloses a signal detector that requires a biasing circuit and consumes a static power even when the high-frequency signal is absent.

What is desired is a high-frequency signal detector that is very fast and consumes zero static power then the high-frequency signal is absent.

SUMMARY OF THE DISCLOSURE

In an embodiment, a signal detector comprises: a rectifier comprising a pair of AC (alternate current) coupling capacitors configured to couple an input voltage signal to a coupled voltage signal, a pair of resistors configured to establish a DC (direct current) value of the coupled voltage signal, a pair of cross-coupling MOS (metal oxide semiconductor) transistors configured to output a self-mixed voltage signal in accordance with a self-mixing of the coupled voltage signal, and a low-pass filter network configured to filter the self-mixed voltage signal into an output voltage signal; a reference voltage generator comprising a current source configured to output a reference current and a reference load configured to establish a reference voltage in accordance with the reference current; and a comparator configured to output a logical signal in accordance with a comparison between the output voltage signal and the reference voltage.

In an embodiment, a method of signal detection comprises: receiving an input voltage signal; using AC (alternate current) coupling to couple the input voltage signal into a coupled voltage signal; establishing a DC (direct current) value of the coupled voltage signal using a resistor; generating a self-mixed voltage signal by performing a self-mixing of the coupled voltage signal using a pair of cross-coupling MOS (metal oxide semiconductor) transistors; generating an output voltage signal by applying low-pass filtering on the self-mixed voltage signal; generating a reference voltage using a reference current terminated with a reference load; and determining a logical signal by comparing the output voltage signal with the reference voltage.

DETAILED DESCRIPTION OF THIS DISCLOSURE

Figure 1:
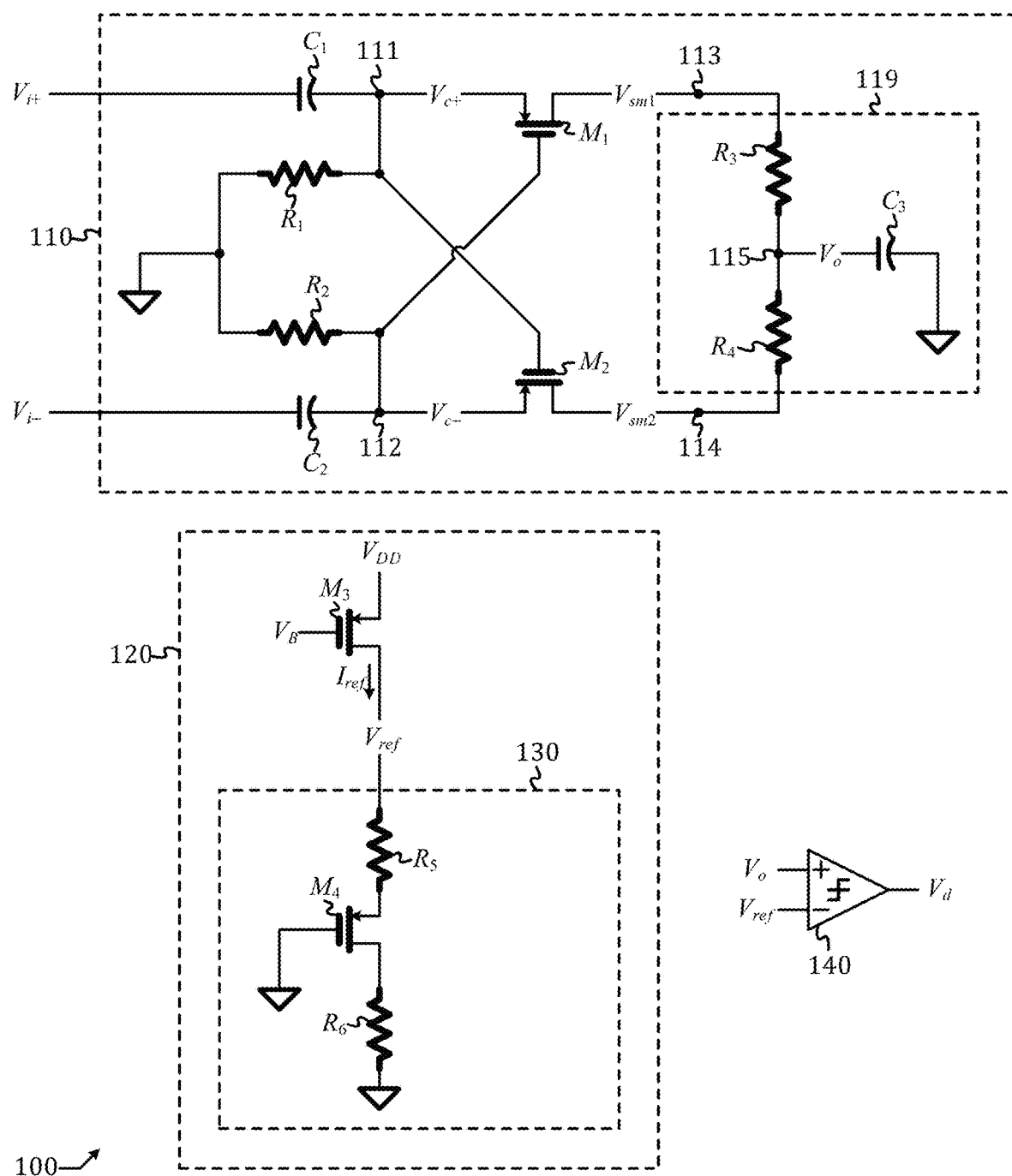
FIG. 1 shows a schematic diagram of a signal detector in accordance with an embodiment of the present disclosure.

The present disclosure is directed to high-frequency signal detection. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "circuit node," "power supply node," "ground node," "differential signal," "voltage," "current," "MOS (metal oxide semiconductor)" "CMOS (complementary metal oxide semiconductor)," "PMOS (P-channel metal oxide semiconductor) transistor," "NMOS (N-channel metal oxide semiconductor) transistor," "square-law characteristic (pertaining to a PMOS transistor or a NMOS transistor)," "resistor," "capacitor," "signal," "comparator," "AC (alternate current)," "AC (alternate current) couple," "DC (direct current)," "DC (direct current) couple," "current source," and "load." Terms and basic concepts like these, when used in a context of microelectronics, are apparent to those of ordinary skill in the art and thus will not be explained in detail here.

Those of ordinary skills in the art can read schematics of a circuit comprising components such as capacitors, resistors, NMOS transistors, PMOS transistors, and so on, and do not need a verbose description about how one component connects with another in the schematics. Those of ordinary skill in the art can also recognize symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain." Those of ordinary skill in the art also understand units such as GHz (giga-Hertz), mV (mini-Volt), µA (micro-Ampere), µm (micron), nm (nanometer), Ohm (Ohm), and fF (femto-Farad).

A MOS transistor, PMOS or NMOS, has a width and a channel length. Sometimes, "channel length" is simply stated as "length" for short when it is obvious from the context that the "length" refers to the "channel length" of the transistor without causing confusion. Width and length of a MOS transistor are referred by a notation "W/L." For instance, when it is said that "W/L of a NMOS transistor are 10 µm/30 nm," it means that "width and length of a NMOS transistor are 10 µm and 30 nm, respectively."

This disclosure is presented in an engineering sense, instead of a rigorous mathematical sense. For instance, "A is equal to B" means "a difference between A and B is smaller than an engineering tolerance. "X is zero" means "an absolute value of X is smaller than an engineering tolerance."

In this disclosure, a "circuit node" is frequently simply stated as a "node" for short, when what it means is clear from a context.

Throughout this disclosure, a ground node is a node of substantially zero voltage (0V). A power supply node is a node of a substantially fixed voltage and is denoted by "$V_{DD}$," which is a convention widely used in the literature. In this disclosure, depending on a context that is apparent to those of ordinary skill in the art, sometimes "$V_{DD}$" refers to the voltage level at the power supply node "$V_{DD}$." For instance, it is apparent that "$V_{DD}$ is 1.5V" mean that the voltage level at the power supply node $V_{DD}$ is 1.5V.

A DC (direct current) node is a node of a substantially stationary voltage level. Both a power supply node and a ground node are a DC node.

A circuit is a collection of a transistor, a capacitor, a resistor, and/or other electronic devices inter-connected in a certain manner to embody a certain function. A network is a circuit or a collection of circuits.

In this present disclosure, a signal is a voltage of a variable level that carry a certain information and can vary with time. A level of the signal at a moment represents a state of the signal at that moment.

A logical signal is a voltage signal of two states: a low state and a high state. The low state is also known as a "0" state, while the high stage is also known as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

Throughout this disclosure, a differential signaling scheme is widely used. When embodied in a differential signaling scheme, a voltage signal comprises two voltages denoted with suffixes "+" and "−," respectively, attached in subscript, and a value of the voltage signal is represented by a difference between said two voltages. For instance, a voltage signal $V_i$ ($V_c$) in a differential signaling embodiment comprises $V_{i+}$ ($V_{c+}$) and $V_{i-}$ ($V_{c-}$) and a value of the voltage signal $V_i$ ($V_c$) is represented by a difference between $V_{i+}$ ($V_{c+}$) and $V_{i-}$ ($V_{c-}$). $V_{i+}$ ($V_{c+}$) is said to be a first end of $V_i$ ($V_c$); $V_{i-}$ ($V_{c-}$) is said to be a second end of $V_i$ ($V_c$). The first end is also referred to as a positive end; the second end is also referred to as a negative end. When a voltage signal is balanced in a differential signaling scheme, an AC value of its positive end is opposite to an AC value of its negative end.

A schematic diagram of signal detector 100 in accordance with an embodiment of the present disclosure is shown in FIG. 1. Signal detector 100 comprises: a rectifier 110 configured to receive an input voltage signal $V_i$ and output an output voltage signal $V_o$; a reference voltage generator 120 configured to output a reference voltage $V_{ref}$; and a comparator 140 configured to output a logical signal $V_d$ in accordance with a comparison between the output voltage signal $V_o$ and the reference voltage $V_{ref}$. An amplitude of the input voltage signal $V_i$ is detected by the rectifier 110 and represented by the output voltage signal $V_o$. The reference voltage $V_{ref}$ represents a target amplitude of the input voltage signal $V_i$. If the logical signal $V_d$ is high (low), it indicates the amplitude of the input voltage signal $V_i$ is greater (smaller) than the target amplitude.

In an embodiment, signal detector 100 is integrated and fabricated on a silicon substrate using a CMO process technology. By way of example but not limitation, a 28 nm CMO process is used, wherein a minimum channel length is 30 nm.

The rectifier 110 comprises: a first capacitors $C_1$ and a second capacitor $C_2$ configured to provide AC (alternate current) coupling between the input voltage signal $V_i$ and a coupled voltage signal $V_c$, the input voltage signal $V_i$ comprising $V_{i+}$ and $V_{i-}$ and the coupled voltage signal $V_c$ comprising $V_{c+}$ and $V_{c-}$ at nodes 111 and 112, respectively, in a differential signaling scheme; a first resistor $R_1$ and a second resistor $R_2$ configured to connect nodes 111 and 112, respectively, to a ground node to establish a DC (direct current) value for $V_{c+}$ and $V_{c-}$, respectively; a pair of cross-coupling PMOS transistors $M_1$ and $M_2$ configured to output a first self-mixed voltage $V_{sm1}$ at node 113 and a second self-mixed voltage $V_{sm2}$ at node 114, wherein $V_{c+}$ connects to the source of $M_1$ and the gate of $M_2$, $V_{c-}$ connects to the source of $M_2$ and the gate of $M_1$, and $M_1$ and $M_2$ are said to be cross-coupling since the gate of $M_1$ connects to the source of $M_2$ and the gate of $M_2$ connects to the source of $M_1$; a low-pass filter embodied by a T-network 119 comprising a center node 115 shunt with a third capacitor $C_3$ to hold the output voltage signal $V_o$, the center node 1115 being coupled to the third node 113 via a third resistor $R_3$ and coupled to the fourth node 114 via a fourth resistor $R_4$.

In an embodiment, a MOS transistor embodies a mixer; when a gate of the MOS transistor connects to a first voltage signal and a source of the MOS transistor connects to a second voltage signal, a drain of the MOS transistor outputs a third voltage signal that contains a mixing product of the first voltage signal and a second voltage signal due to a square-law characteristic of a MOS transistor, wherein the third voltage signal is approximately proportional to a square of a difference between the first voltage signal and the second voltage signal. Therefore, PMOS transistor $M_1$ embodies a mixing of $V_{c-}$ with $V_{c+}$, while PMOS transistor $M_2$ embodies a mixing of $V_{c+}$ with $V_{c-}$. Since $V_{c+}$ and $V_{c-}$ are the same signal but with opposite signs in a differential signaling scheme, the mixing function that PMOS transistors $M_1$ and $M_2$ perform are said to be self-mixing.

The T-network 119 performs a first low-pass filtering on the first self-mixed voltages $V_{sm1}$ using the third resistor $R_3$ and the third capacitor $C_3$ and a second low-pass filtering on the second self-mixed voltages $V_{sm2}$ using the fourth resistor $R_4$ and the third capacitor $C_3$ and consolidates outputs from the first low-pass filtering and the second low-pass filtering into the output voltage signal $V_o$ at the center node 115.

Figure 2A:
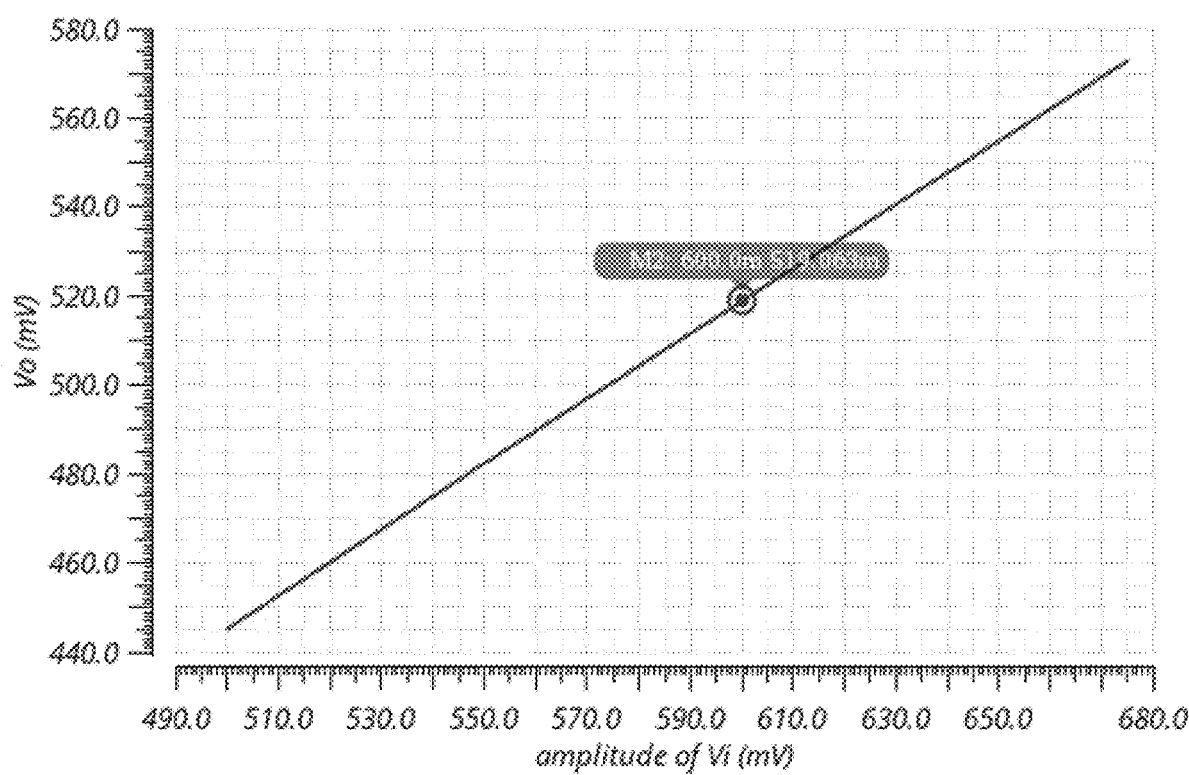
FIG. 2A shows a simulation result of an output voltage versus an amplitude of an input voltage signal for the signal detector of FIG. 1.
Figure 2B:
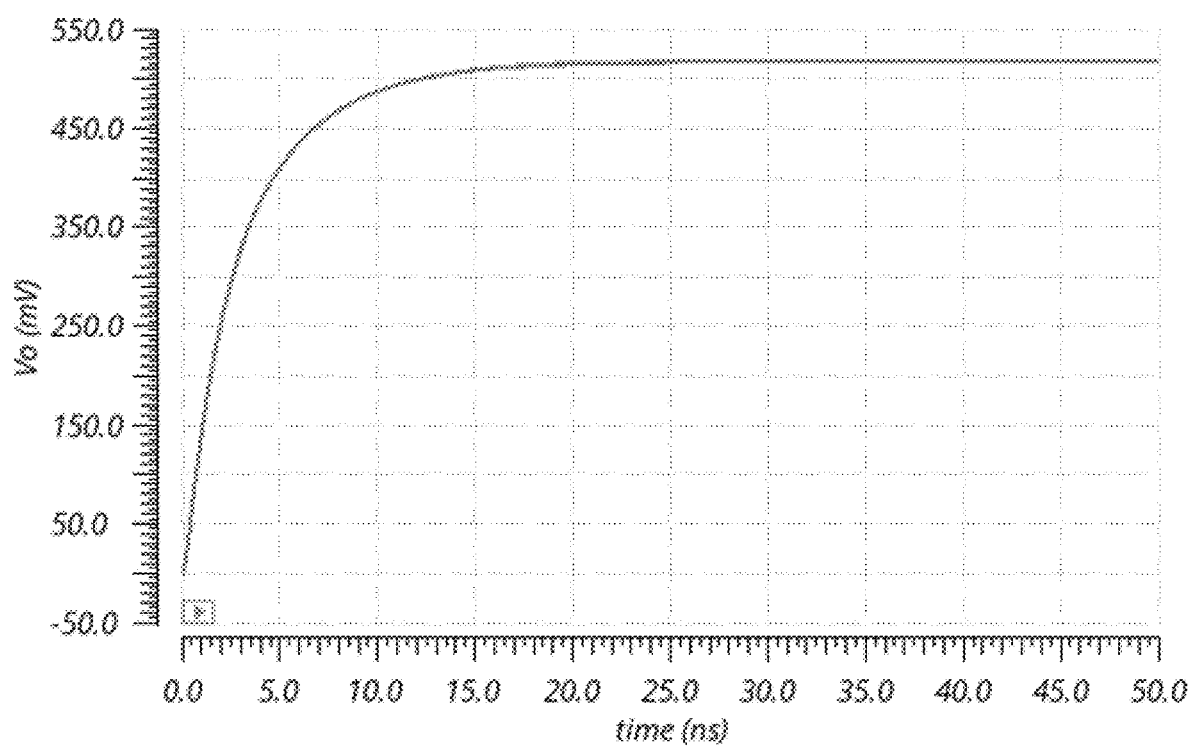
FIG. 2B shows a simulation result of an output voltage signal waveform for the signal detector of FIG. 1.

By way of example but not limitation, in an embodiment: a frequency of $V_i$ is 8.5 GHz; $C_1$ and $C_2$ are 77 fF; $R_1$ and $R_2$ are 30K Ohm; W/L of PMOS transistors $M_1$ and $M_2$ are 600 nm/250 nm; $R_3$ and $R_4$ are 30K Ohm; and $C_3$ are 50 fF. A simulation result of a value of $V_o$ versus an amplitude of $V_i$ is shown in FIG. 2A; the value of $V_o$ increases linearly with an increase of the amplitude of $V_i$. This way, by comparing the value of $V_o$ with a proper reference voltage in accordance to a target value of the amplitude of $V_i$, we can infer whether the amplitude of $V_i$ is greater or smaller than the target value. For instance, if a target value of the amplitude of $V_i$ is 600 mV, the reference voltage will be 519 mV, as marked in FIG. 2A; if $V_o$ is higher (lower) than the reference voltage 519 mV, it indicates the amplitude of $V_i$ is greater (smaller) than the target value 600 mV. The rectifier 110 is very fast. A simulation result of a waveform of $V_o$ in response to an input voltage signal $V_i$ of 600 mV in amplitude is shown in FIG. 2B. It shows that $V_o$ settles in approximately 20 ns. The rectifier 110 is also very power efficient, as it does not consume any static current; that is, the current consumption is zero in the absence of an input voltage signal.

The reference voltage generator 120 comprises: a current source embodied by a third PMOS transistor $M_3$ configured to output a reference current $I_{ref}$ in accordance with a bias voltage $V_B$ and a reference load 130 configured to establish the reference voltage $V_{ref}$ in accordance with the reference current $I_{ref}$. The reference load 130 comprises: a series connection of a fifth resistor $R_s$, a fourth PMOS transistor $M_4$, and a sixth resistor $R_6$. The reference load 130 is to establish the reference voltage $V_{ref}$ in a way that mimics the rectifier 110. By way of example but not limitation: $V_{DD}$ is 1.5V; $V_B$ is 490 mV; W/L of PMOS transistor $M_3$ is 5 μm/500 nm; $I_{ref}$ is 12.5 μA; $V_{ref}$ is 519 mV; $R_5$ is 625 Ohm; W/L of PMOS transistor $M_4$ is 70.4 μm/250 nm; and $R_6$ is 40K Ohm.

Comparators are well known in the prior art and thus not described in detail. Comparator 140 can be embodied using whatever comparator circuit known in the prior art in accordance with a discretion of a circuit designer.

Given a network comprising a plurality of PMOS transistors and/or a plurality of NMOS transistors along with a plurality of passive elements (capacitors, resistors, or inductors), there exists an alternative network that is functionally equivalent to the given network, wherein the alternative network is modified from the given network by replacing every PMOS transistor with a NMOS transistor, replacing every NMOS transistor with a PMOS transistor, replacing every power supply node with a ground node, and replacing every ground with a power supply node. The alternative network is a "flipped" version of the given network and preserves the same function.

Although it is shown that resistors $R_1$ and $R_2$ couple nodes 111 and 112, respectively, to a ground node, it is just an example but not limitation. $R_1$ and $R_2$ are used to establish a DC value of nodes 111 and 112, and the DC value doesn't necessarily need to be zero. The node that $R_1$ and $R_2$ jointly connect to can be a DC node that is not a ground node.

Figure 3:
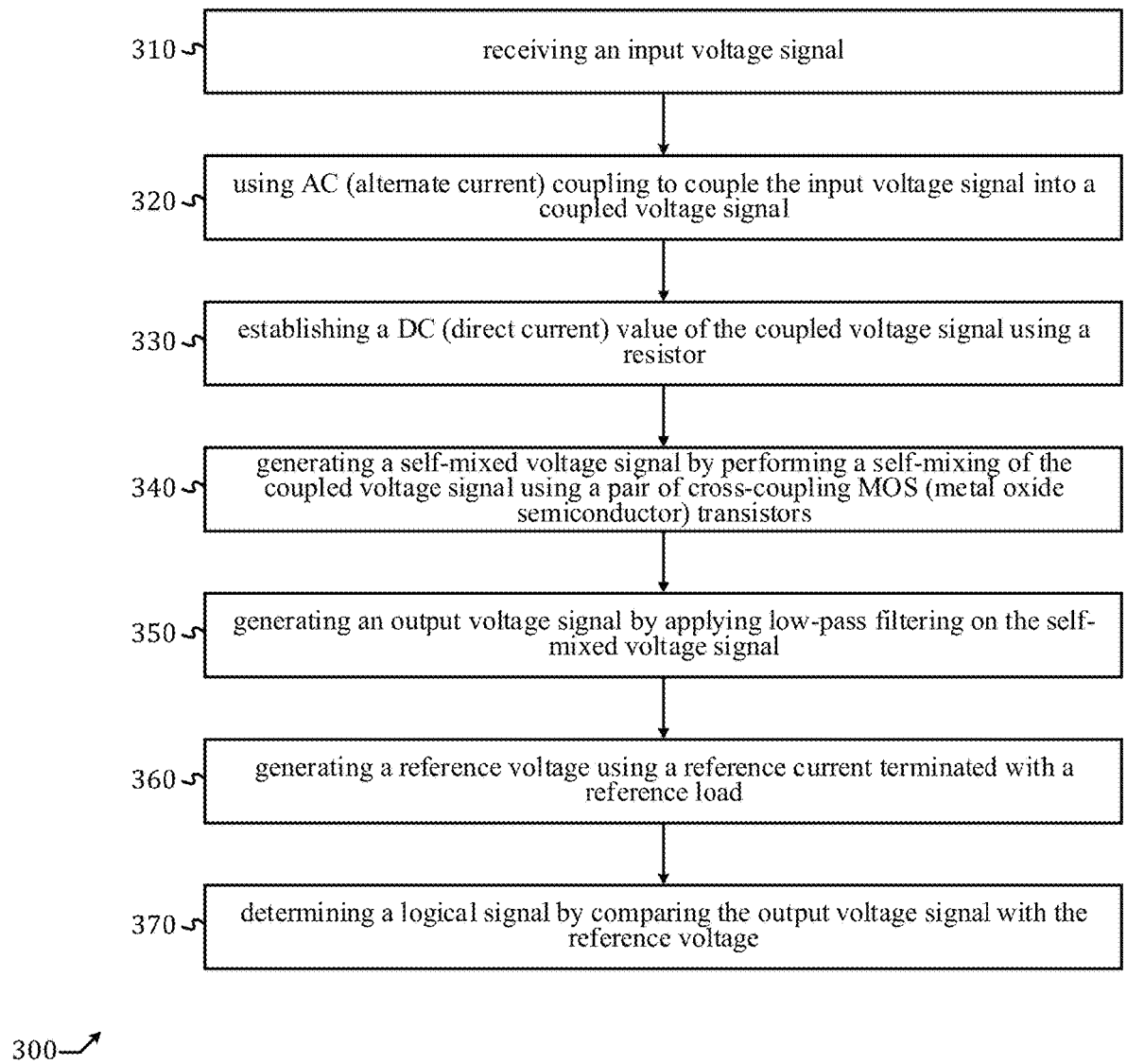
FIG. 3 shows a flow diagram of a method of signal detection in accordance with an embodiment of the present disclosure.

As illustrate by a flow diagram 300 shown in FIG. 3, a method of signal detection comprises: (step 310) receiving an input voltage signal; (step 320) using AC (alternate current) coupling to couple the input voltage signal into a coupled voltage signal; (step 330) establishing a DC (direct current) value of the coupled voltage signal using a resistor; (step 340) generating a self-mixed voltage signal by performing a self-mixing of the coupled voltage signal using a pair of cross-coupling MOS (metal oxide semiconductor) transistors; (step 350) generating an output voltage signal by applying low-pass filtering on the self-mixed voltage signal; (step 360) generating a reference voltage using a reference current terminated with a reference load; and (step 370) determining a logical signal by comparing the output voltage signal with the reference voltage.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A signal detector comprising:
   a rectifier comprising a pair of AC (alternate current) coupling capacitors configured to couple an input voltage signal to a coupled voltage signal, a pair of resistors configured to establish a DC (direct current) value of the coupled voltage signal, a pair of cross-coupling MOS (metal oxide semiconductor) transistors configured to output a self-mixed voltage signal in accordance with a self-mixing of the coupled voltage signal, a low-pass filter network configured to filter the self-mixed voltage signal into an output voltage signal;
   a reference voltage generator comprising a current source configure to output a reference current and a reference load configured to establish a reference voltage in accordance with the reference current; and
   a comparator configured to output a logical signal in accordance with a comparison between the output voltage signal and the reference voltage,
   wherein said pair of resistors comprises a first resistor configured to couple the first end of the coupled voltage signal to a DC node and a second resistor configured to couple the second end of the coupled voltage signal to the DC node, wherein an end of the first resistor is directly connected to the DC node and an end of the second resistor is directly connected to the DC node.

2. The signal detector of claim 1, wherein said pair of AC coupling capacitors comprises a first capacitor configured to couple a first end of the input voltage signal to a first end of the coupled voltage signal and a second capacitor configured to couple a second end of the input voltage signal to a second end of the coupled voltage signal.

3. The signal detector of claim 1, wherein said pair of MOS transistors comprises a first MOS transistor and a second MOS transistor, the first end of the coupled voltage signal couples to a source of the first MOS transistor and a gate of the second MOS transistor, while the second end of the coupled voltage signal couples to a source of the second MOS transistor and a gate of the first MOS transistor.

4. The signal detector of claim 3, wherein the low-pass filter comprises a third capacitor configured to hold the output voltage signal at a center node, a third resistor configured to couple a drain of the first MOS transistor to the center node, and a fourth resistor configured to couple a drain of the second MOS transistor to the center node.

5. The signal detector of claim 4, wherein the current source comprises a third MOS transistor configured to output the reference current in accordance with a bias voltage.

6. The signal detector of claim 5, wherein the reference load comprises a series connection of a fifth resistor, a fourth MOS transistor, and a sixth resistor.

7. A method of signal detection comprising:
   receiving an input voltage signal;
   using AC (alternate current) coupling to couple the input voltage signal into a coupled voltage signal;
   establishing a DC (direct current) value of the coupled voltage signal using a resistor;
   generating a self-mixed voltage signal by performing a self-mixing of the coupled voltage signal using a pair of cross-coupling MOS (metal oxide semiconductor) transistors;
   generating an output voltage signal by applying low-pass filtering on the self-mixed voltage signal;
   generating a reference voltage using a reference current terminated with a reference load; and
   determining a logical signal by comparing the output voltage signal with the reference voltage,
   wherein establishing a DC (direct current) value of the coupled voltage signal using a resistor comprises: using a first resistor to couple the first end of the coupled voltage signal to a DC node and using a second resistor to couple the second end of the coupled voltage signal to the DC node, wherein an end of the first resistor is directly connected to the DC node and an end of the second resistor is directly connected to the DC node.

8. The method of signal detection of claim 7, wherein using AC (alternate current) coupling to couple the input voltage signal into a coupled voltage signal comprises using a first capacitor to couple a first end of the input voltage signal to a first end of the coupled voltage signal and using a second capacitor to couple a second end of the input voltage signal to a second end of the coupled voltage signal.

9. The method of signal detection of claim 7, wherein said pair of cross-coupling MOS transistors comprises a first MOS transistor and a second MOS transistor, the first end of the coupled voltage signal being coupled to a source of the first MOS transistor and a gate of the second MOS transistor, the second end of the coupled voltage signal being coupled to a source of the second MOS transistor and a gate of the first MOS transistor.

10. The method of signal detection of claim 9, wherein generating an output voltage signal by applying low-pass filtering on the self-mixed voltage signal comprises: using a third capacitor to hold the output voltage signal at a center node, coupling a drain of the first MOS transistor to the center node via a third resistor, and coupling a drain of the second MOS transistor to the center node via a fourth resistor.

11. The method of signal detection of claim 10, wherein the reference current is output from a current source comprising a third MOS transistor controlled by a bias voltage.

12. The method of signal detection of claim 11, wherein the reference load comprises a series connection of a fifth resistor, a fourth MOS transistor, and a sixth resistor.

* * * * *